US005462887A

United States Patent [19]
Glück

[11] Patent Number: 5,462,887
[45] Date of Patent: Oct. 31, 1995

[54] PROCESS FOR MAKING A MATRIX OF THIN LAYER TRANSISTORS WITH MEMORY CAPACITORS

[75] Inventor: Joachim Glück, Stutgart, Germany

[73] Assignee: Ernst Luder, Stuttgart, Germany

[21] Appl. No.: 343,108

[22] Filed: Nov. 22, 1994

[30] Foreign Application Priority Data

Nov. 22, 1993 [DE] Germany ............................ 43 39 721.2

[51] Int. Cl.$^6$ ................................................ H01L 21/786
[52] U.S. Cl. .................. 437/48; 437/51; 437/60; 437/181; 148/DIG. 105
[58] Field of Search ............................ 437/48, 51, 181, 437/60, 246; 148/DIG. 105

[56] References Cited

U.S. PATENT DOCUMENTS

| | | | |
|---|---|---|---|
| 4,933,296 | 6/1990 | Parks et al. | 437/181 |
| 5,032,531 | 7/1991 | Tsutsui et al. | 437/51 |
| 5,054,887 | 10/1991 | Kato et al. | |
| 5,087,113 | 2/1992 | Sakono et al. | |
| 5,153,690 | 6/1992 | Tsukada et al. | |
| 5,346,833 | 9/1994 | Wu | 437/181 |

FOREIGN PATENT DOCUMENTS

| | | |
|---|---|---|
| 4310640 | 11/1994 | Germany . |
| 4056168 | 2/1992 | Japan . |
| 5188396 | 7/1993 | Japan . |

OTHER PUBLICATIONS

Japanese Journal of Applied Physics, vol. 32, No. 1B, Part 1, pp. 469–473, 1993.

*Primary Examiner*—Brian E. Hearn
*Assistant Examiner*—Michael Trinh
*Attorney, Agent, or Firm*—Michael J. Striker

[57] ABSTRACT

The process for making a matrix of thin layer transistors with memory capacitors includes forming a first conductive layer on a substrate, and in a first mask step, etching it to form row conductors of the matrix, gate contacts of the thin layer transistors and ground electrodes of the memory capacitors; forming a gate-insulating layer for the thin layer transistors; forming a semiconductor layer, especially an a-Si:H semiconductor layer; applying a p- or n-doped semiconductor layer to provide drain and source contacts; forming and etching a second conductive layer for the column conductors of the matrix of the thin layer transistors, the drain and source contacts of the thin layer transistors and the counter electrodes of the memory capacitors in a second mask step; plasma etching of the doped semiconductor layer with the second conductor layer acting as mask and determining an end of the etching process by observing the optical emission of an etching plasma used for the plasma etching; etching the undoped semconductor layer in a third mask step; forming and etching a transparent conductive layer to form an screen element electrode and metallizing the column conductors of the matrix of thin layer transistors to provide conductive connection of their drain contacts with the counter electrodes of the memory capacitors in a fourth mask step; and forming a transparent passivating layer.

19 Claims, 10 Drawing Sheets

PROCESS FOR MAKING A MATRIX OF THIN LAYER TRANSISTORS WITH MEMORY CAPACITORS

BACKGROUND OF THE INVENTION

The instant invention relates to a process for making a matrix of thin layer transistors and, more particularly, to a matrix of thin layer transistors with memory capacitors, especially for a liquid crystal display screen.

A process for making a matrix of a-Si:H-thin layer transistors with memory capacitors is currently known and described in German Published Patent Application 43 10 640.4. This process requires only three photolithographic masks and transistors of higher mobility are obtained from it. In the known manufacturing process a layer sequence comprising an insulating layer, a-Si:H layer acting as an undoped semiconductor layer, a doped semiconductor layer and a conductive layer is provided having the layers one following the other without intervening structures between the individual layers and is subsequently structured in two masking operations. In this method the conductive layer, which subsequently serves as a mask for etching of the doped and undoped layers, is first structured first. The end of the etching process of the semiconductor layers may be controlled by controlling the optical emission of the etching plasma. The doped semiconductor layer is however etched only in the vicinity of the semiconductor layer ducts, also on a surface area, which amounts to less than 0.5% of the total substrate surface area exposed to the etching plasma. The optical signal, which is produced by this reduced surface area in the etching plasma, is reduced in intensity to such an extent that determination of the end point of the etching process of the doped semiconductor layer leads to great difficulties. This leads frequently to overetching, chiefly the intrinsic semiconductor layer under the doped semiconductor layer is etched more rapidly than the doped layer.

SUMMARY OF THE INVENTION

It is an object of the present invention to provide a reliable process for making a matrix of thin layer transistors with memory capacitors, particularly for a liquid crystal display screen.

According to the invention the process of the above-described type for making a matrix of thin layer transistors with memory capacitors comprises the steps of:

a) applying a first electrically conductive layer to a substrate and, in a first mask step, structuring it to form row conductors of the thin layer transistors, gate contacts of the thin layer transistors and ground electrodes of the memory capacitors;

b) applying a gate-insulating layer for the thin layer transistors;

c) applying a semiconductor layer, especially an a-Si:H semiconductor layer;

d) applying a p- or n-doped semiconductor layer to provide drain and source contacts of the thin layer transistors;

e) applying and structuring a second electrically conductive layer to form the column conductors of the thin layer transistors, the drain and source contacts of the thin layer transistors and the counter electrodes of the memory capacitors in a second mask step;

f) plasma etching of the doped semiconductor layer with the second conductor layer acting as mask and determining an end of the plasma etching by monitoring of the optical emission of an etching plasma used for the plasma etching;

g) structuring the undoped semconductor layer in a third mask step;

h) applying and structuring a transparent conductive layer to form a screen element electrode and metallizing to form the column conductors of the thin layer transistors and to provide conductive connection of the drain contacts of the thin layer transistors with the counter electrodes of the memory capacitors in a fourth mask step; and i) applying a transparent passivating layer.

The process according to the invention requires four conventional photolithographic mask steps. In contrast to the three mask steps of German Patent Application 43 10 640.4 first only the doped semiconductor layer is etched with the structured second conductive layer as a mask. The doped semiconductor layer extends over the entire surface of the substrate, since the undoped semiconductor layer is structured in a following step. Because of this large surface area, the intensity change of the optical plasma emission is so large that a determination of the end point of the etching process is possible without any problems. Overetching can therefore be avoided and the yield of the process can be increased dramatically. This advantage compensates for the additional cost due to the additional mask step in comparison to the three mask process.

Instead of a process in which a transparent conductive layer is applied and structured to form screen element electrodes and subsequently a transparent passivating layer is applied, also a process in which a transparent insulating layer is applied in a fourth mask step and structured so that the insulating material is removed at the connection points of the matrix, the drain contacts of the thin layer transistors and at the counter electrodes of the memory capacitors also satisfies the purpose or object of the invention.

The use of indium-zinc oxide as transparent conductive layer for the screen element electrodes in the process according to the invention avoids a lift-off step required in the above-described three and four mask processes for structuring the screen element electrodes and facilitates also an etching process. In the three and four mask processes the indium-zinc oxide layer lies partially on the second conductive layer, which for example can comprise aluminum. Collectively the etching agent for the indium-zinc oxide layer would attack the second conductive layer, so that here an insolated etching of the indium-zinc oxide layer is impossible. In the above-described five mask process a transparent oxide, which resists etching substances for etching indium-zinc oxide, is applied prior to application of the indium-zinc oxide layer. Thus in the five mask process joint structuring can be performed with the help of etching processes. Additional devices required for lift-off Technology are not required in this process. This process thus may be used particularly in already established manufacturing operations with advantage. The advantage of an easily analyzable optical emission from the etching plasma during structuring of the doped semiconductor layer, the intensity of emission advantageously being measured at a wavelength of 240.4 nm, is likewise an advantage in this process. The transparent insulator in the fourth mask step can also be removed in the vicinity of the screen element electrodes of a liquid crystal display screen to improve the transmission of the liquid crystal display screen. Furthermore in the five mask process the transparent conductive layer can be structured so that a direct conductive connection to the drain contacts of the thin layer transistors, the column conductors of the transistor matrix and the counter electrodes of the memory capacitors is provided, which simplifies the connection to the matrix of thin layer transistors. Also the transparent conductive layer can cover the connecting points of the row conductors and column conductors of the thin layer transistor matrix, so that a reliable electrical connection for driving the display screen with an associated external driver circuit means can be guaranteed and it can provide a second metallization of the columns. The second metallization of the column conductors produces redundant components for repair of broken column conductors.

According to both processes according to the invention the insulation of the cross-over points of the column and row conductors through the second conductive layer masks and thus can be protected in all etching steps. Because of that, a high reliablity and a lack of defects, particularly short circuits, can be obtained at the conductor cross-over points. Furthermore the gate-insulating layer together with the undoped semiconductor layer can be structured in that way.

$SiN_x$, $SiO_2$ and $Ta_2O_3$ or combinations of these materials can be used as gate-insulating layer material. For the first metallization of the column conductors and the drain and source contacts chromium, titanium, tantalum or chromium and aluminum as well as similar allied materials can be applied by sputtering or evaporation. The layer for the second metallization of the columns may be applied for example by sputtering or evaporation and subsequently structured in an etching or lift-off process. Also the passivation can take place via a CVD (Chemical Vapor Deposition) or sputtering process and subsequently wet or dry etching can be performed.

In a preferred embodiment the following layers are deposited one after the other on the substrate with a 200 nm chromium layer for the row conductors of the thin layer transistors, the gate contacts of the transistors and the ground electrodes of the memory capacitors: 400 nm $SiN_x$ as gate-insulating layer, 130 nm a-Si:H as semiconductor layer and 50 nm $n^+$-a-Si:H as drain and source contacts. Thin layer transistors with a high mobility and comparatively higher electrical and thermal stability can be obtained by providing the gate-insulating layer, the intrinsic and doped semiconductor layer without interruption of the vacuum during the process. The uncoupling of the gate-insulating layer, the semiconductor layer and the drain and source electrodes can occur in a vacuum in a PECVD (Plasma Enhanced Chemical Vapor Deposition) system.

BRIEF DESCRIPTION OF THE DRAWING

The objects, features and advantages of the present invention will now be illustrated in more detail by the following detailed description, reference being made to the accompanying drawing in which.

DESCRIPTION OF THE PREFERRED EMBODIMENTS

Figure 1:
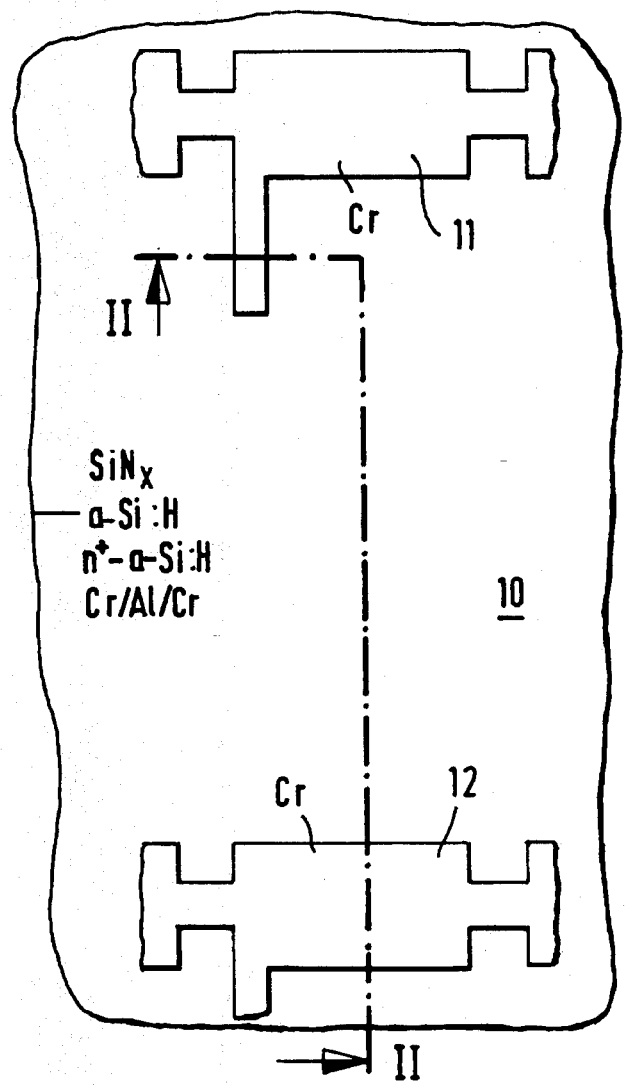
FIG. 1 is a top view of thin layer transistor and a memory capacitor of an screen element of a liquid crystal display screen in a first step in a first embodiment of a process for making a matrix of thin layer transistors according to the invention.
Figure 2:
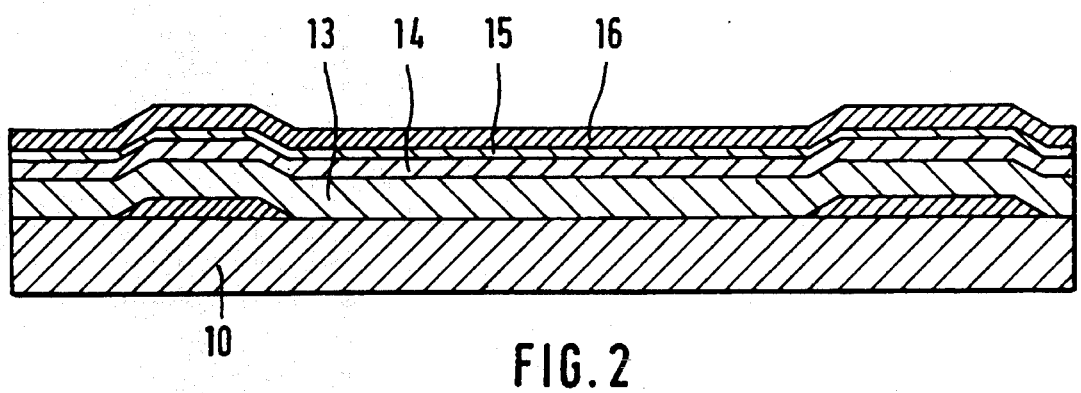
FIG. 2 is a transverse cross-sectional view through the screen element shown in FIG. 1 taken along the section line II—II in FIG. 1.
Figure 3:
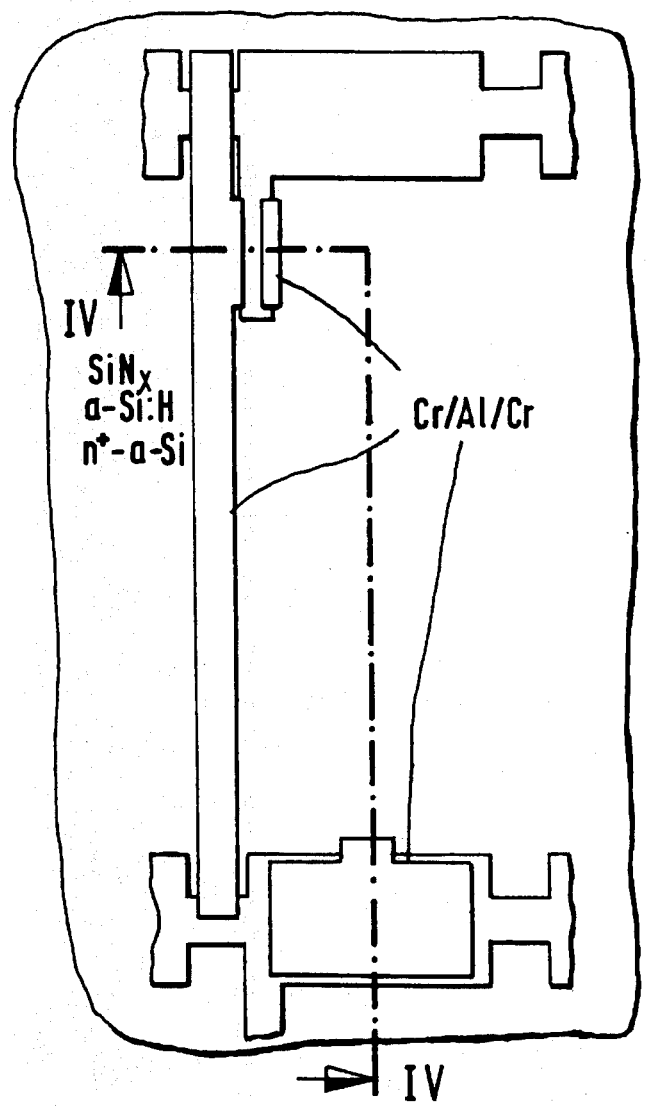
FIG. 3 is a top view of the screen element according to FIG. 1 in a second step of the first embodiment of the process according to the invention.
Figure 4:
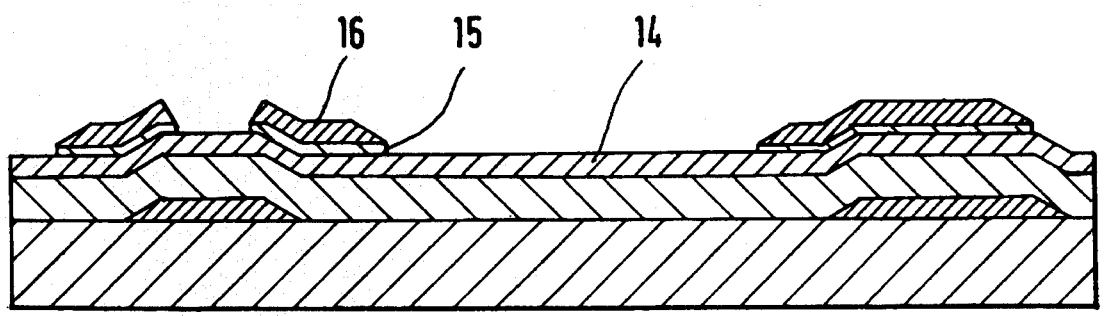
FIG. 4 is a transverse cross-sectional view through the screen element shown in FIG. 3 taken along the section line IV—IV in FIG. 3.
Figure 8:
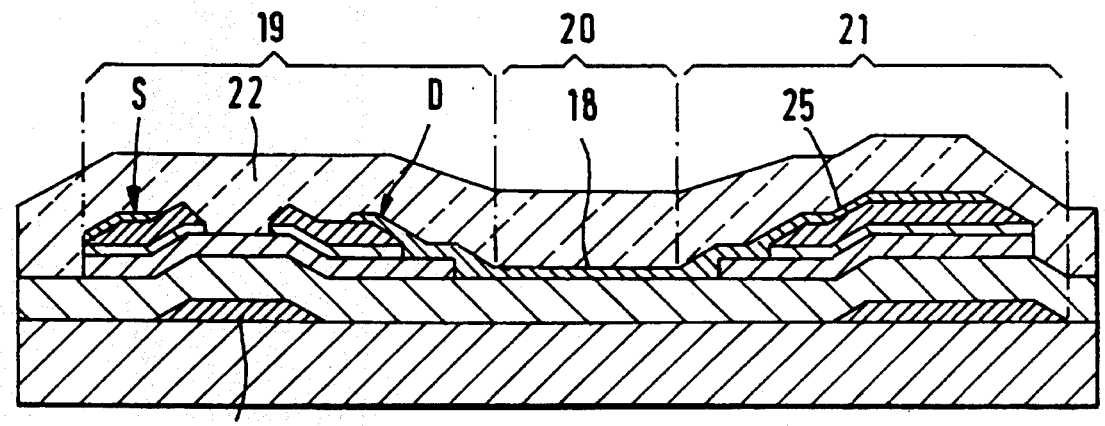
FIG. 8 is a transverse cross-sectional view through the screen element shown in FIG. 7 taken along the section line VIII—VIII in FIG. 7.

FIG. 1 shows two structured chromium surface layer portions 11 and 12, which are part of a first electrically conductive layer applied to the substrate 10, on the substrate 10 which were applied by sputtering in a first embodiment of the method according to the invention. The upper chromium surface layer portion 11 forms a row conductor and gate-contact G for a thin layer transistor 19 (FIG. 8) of the illustrated display screen element. The lower chromium surface layer portion 12 forms the ground electrode of a memory capacitor 21 (FIG. 8). Instead of chromium, Al, Mo, Ta or combinations of these materials can also be used. Conventional photolithographic techniques and etching technology are used for structuring the chromium surface layers 11 and 12. The substrate 10, as also is apparent from the cross-section in FIG. 2, is provided with a three-fold layer comprising a silicon nitride layer 13 as a gate-insulating layer, an undoped amorphous silicon layer 14 as an undoped semiconductor layer and a phosphorus-doped amorphous or microcrystalline silicon layer 15 for drain and source contacts by a PECVD process (PECVD= plasma enhanced chemical vapor deposition). A second electrically conductive layer 16, in this embodiment comprising Cr/Al/Cr, is applied to this three-fold layer 13 to 15 by sputtering or vapor deposition. Subsequently the second electrically conductive layer 16 is structured in a second mask step (FIGS. 3 and 4). Also here conventional photolithographic and etching technologies can be used.

Figure 5:
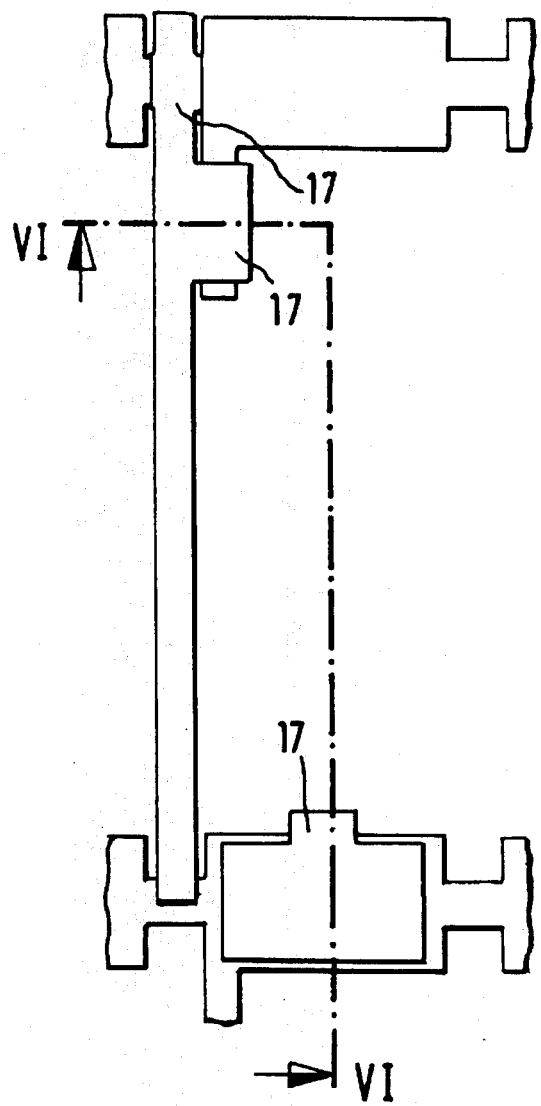
FIG. 5 is a top view of the screen element according to FIG. 1 in a second step of the process according to the first embodiment.
Figure 6:
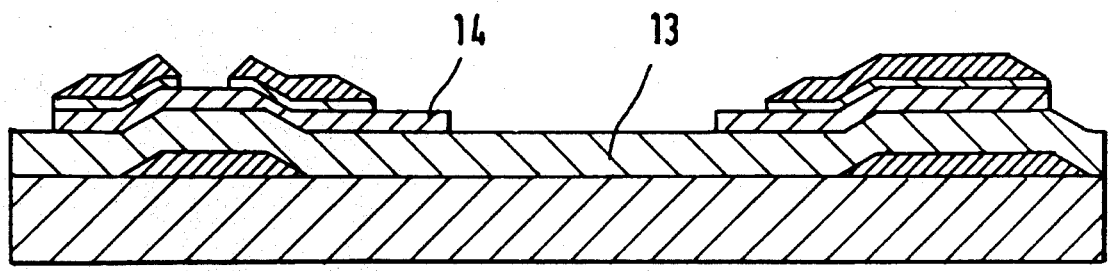
FIG. 6 is a transverse cross-sectional view through the screen element shown in FIG. 5 taken along the section line VI—VI in FIG. 5.
Figure 7:
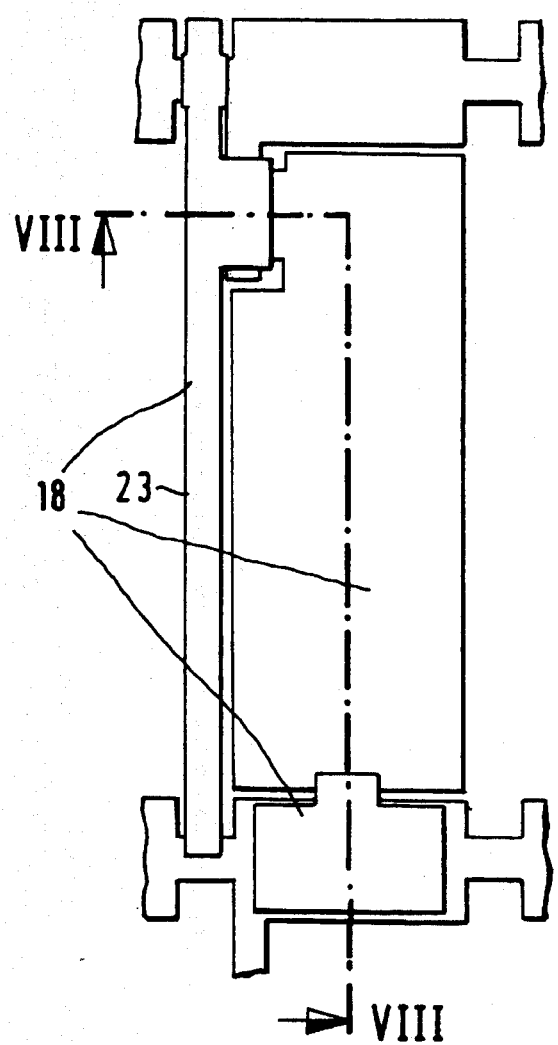
FIG. 7 is a top view of the screen element according to FIG. 1 at the end of the process according to the first embodiment of the invention.
Figure 9:
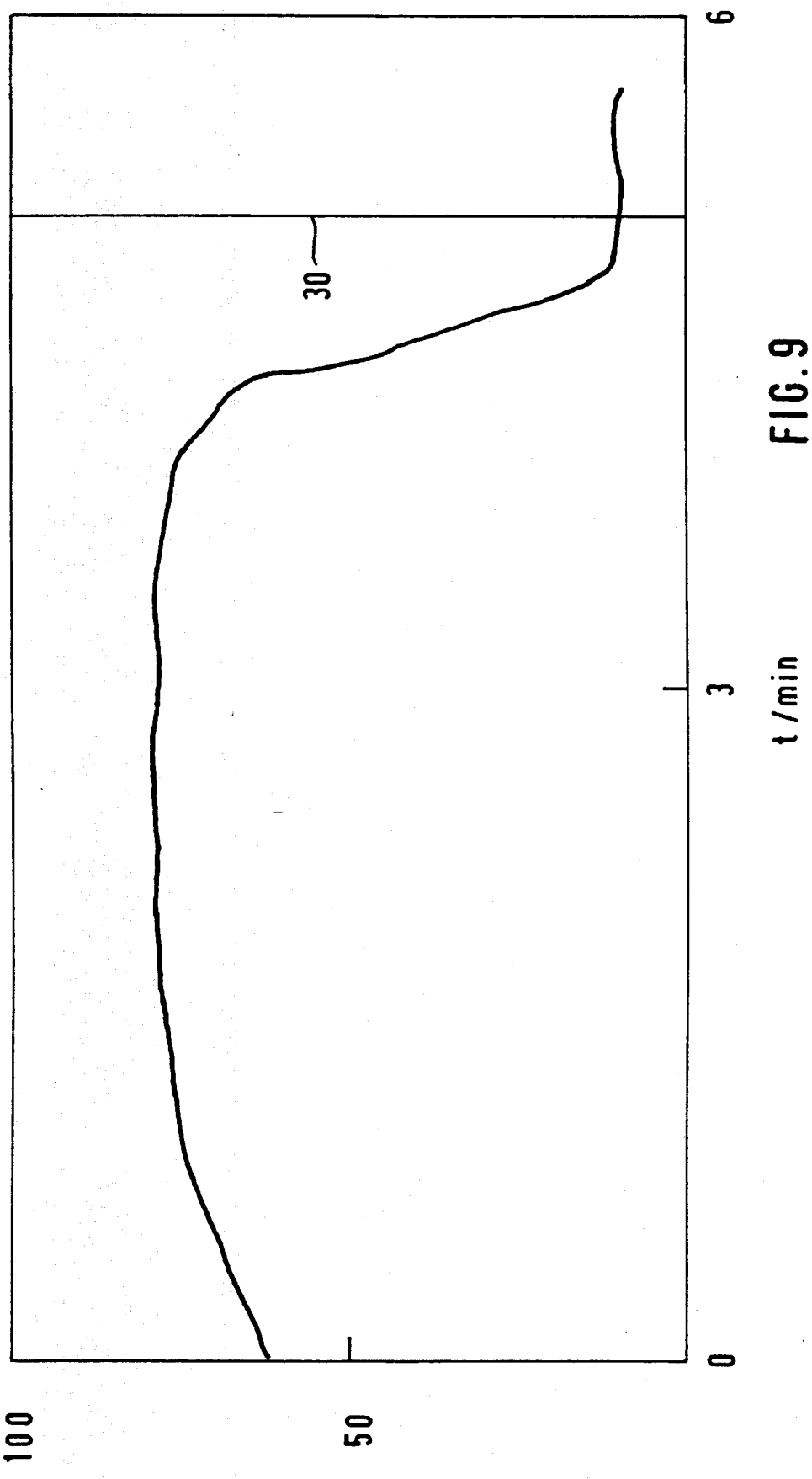
FIG. 9 is a graphical illustration of the intensity of a spectral line of the etching plasma during the etching of the semiconductor.
Figure 10:
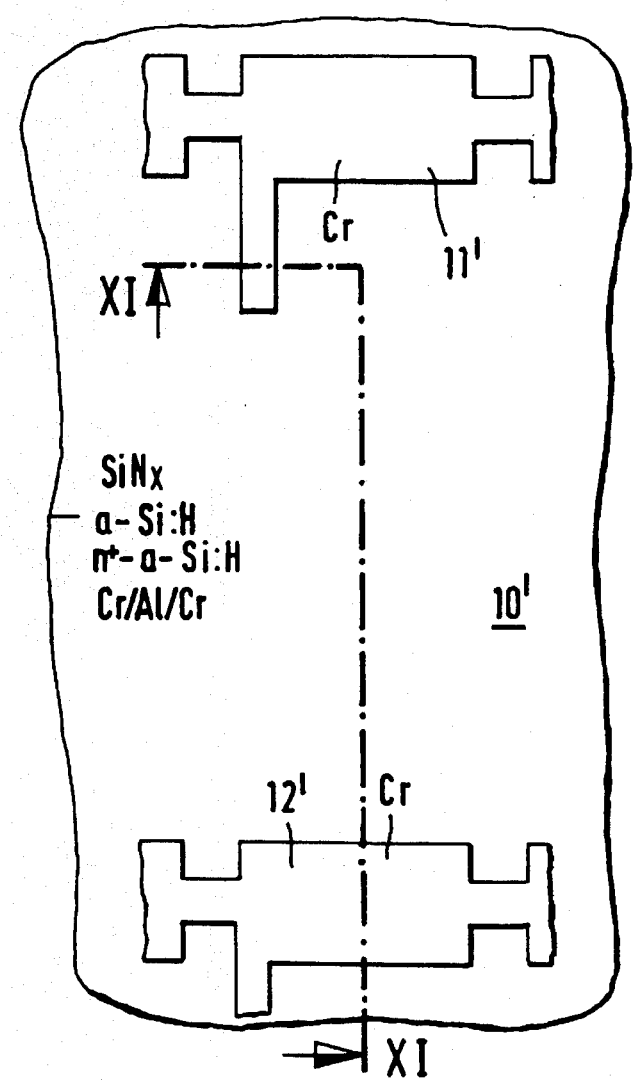
FIG. 10 is a top view of thin layer transistor and a memory capacitor of an screen element of a liquid crystal display screen in a first step in a second embodiment of a process for making a matrix of thin layer transistors according to the invention.
Figure 11:
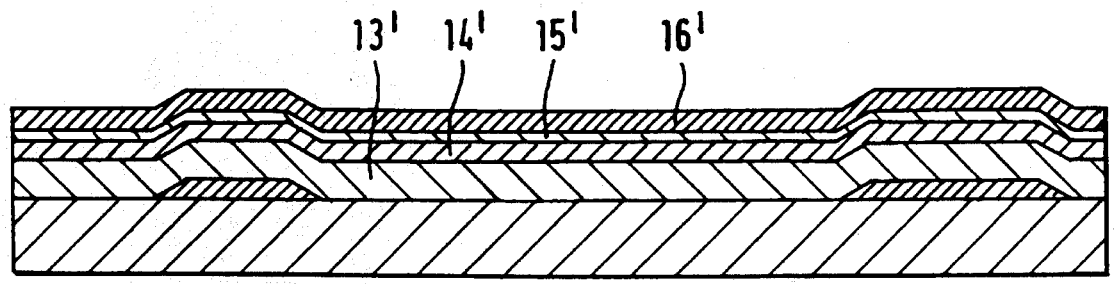
FIG. 11 is a transverse cross-sectional view through the screen element shown in FIG. 10 taken along the section line XI—XI in FIG. 10.
Figure 12:
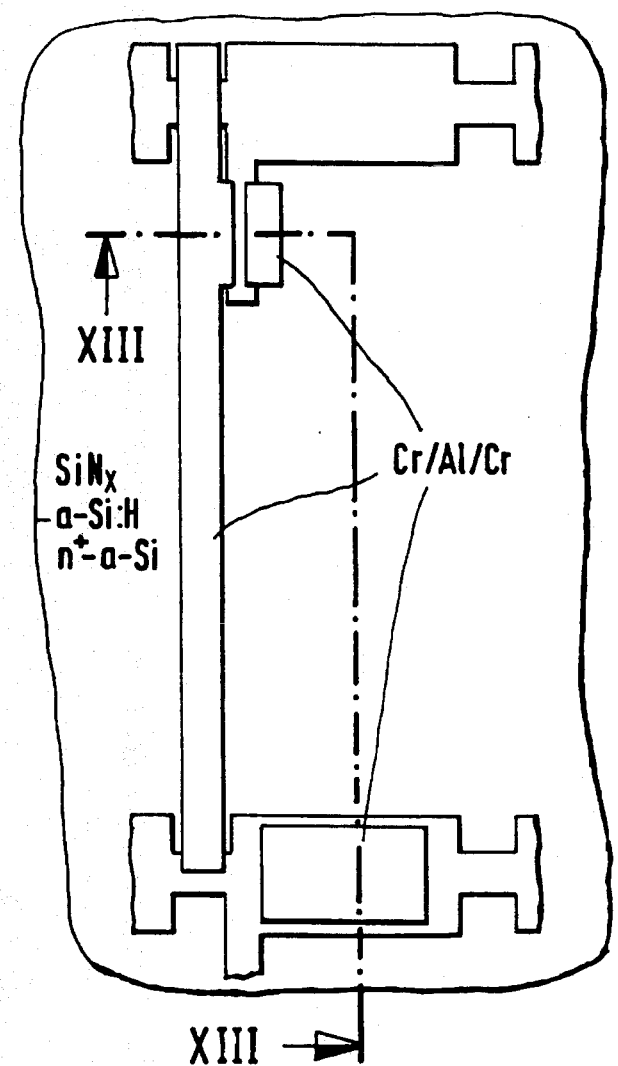
FIG. 12 is a top view of the screen element according to FIG. 10 in a second step of the process according to the second embodiment of the invention.
Figure 13:
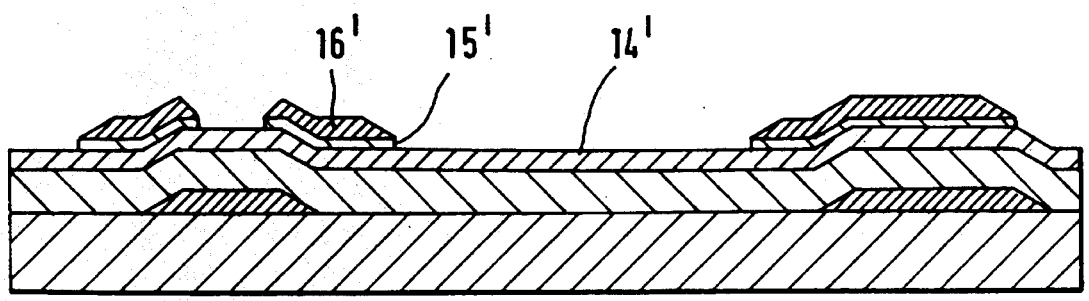
FIG. 13 is a transverse cross-sectional view through the screen element shown in FIG. 12 taken along the section line XIII—XIII in FIG. 12.
Figure 14:
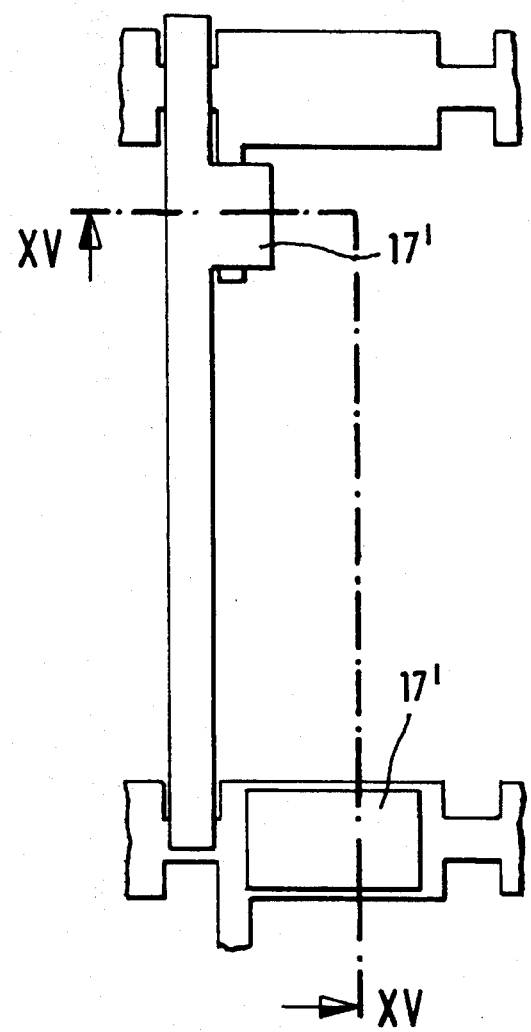
FIG. 14 is a top view of the screen element according to FIG. 10 in a second step of the process according to the second embodiment of the invention.
Figure 15:
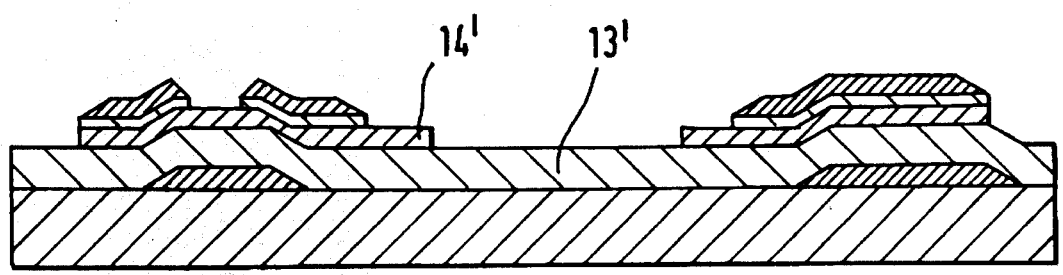
FIG. 15 is a transverse cross-sectional view through the screen element shown in FIG. 14 taken along the section line XV—XV in FIG. 14.

This structured second electrically conductive layer 16 thus forms the column conductors 23, the drain and source contacts D,S and the counter or cover electrodes (25) of the memory capacitors 21 (FIGS. 7 and 8). Subsequently a dry etching of the phosphorus doped amorphous or microcrystalline silicon layer 15 occurs by a plasma etching process. The structured second electrically conductive layer 16, as it appears for example in FIG. 4, can be used as etching mask. Since the plasma etching process is not selective for doped and/or undoped silicon, the etching process will not stop by itself at the undoped silicon layer 14. At the same time however the undoped silicon layer 14 must not be etched away so the etching process must be monitored with an end point control device. The end point control device monitors the optical emission of the etching plasma. During the preferred monitoring the time course of the emission intensity of the optical emission of the etching plasma is measured at 240.4 nm as shown in FIG. 9. This intensity changes significantly after the etching of the doped silicon has been completed. This is observed in the graphical illustration of FIG. 9 as the time at which the line 30 is crossed by the curve showing the intensity of the spectral line. This crossing point reliably marks the end of the etching of the doped silicon semiconductor layer. As shown in FIGS. 5 and 6, subsequently the undoped amorphous silicon layer 14 is structured with a photolithographic process and plasma technology in a third masking step. In FIG. 5 the positions 17 at which the semiconductor layer 14 remains exposed are shown. This step also serves to insulate the thin layer transistors of the individual display screen elements from each other. In FIGS. 7 and 8 the screen element is shown after applying a transparent, conductive oxide layer 18, such as indium-zinc oxide, by sputtering or vacuum vapor deposition techniques and structuring it by conventional photolithographic method steps and a Lift-Off step. The indium-zinc oxide layer forms the actual electrode of the screen element 20 and a redundant structural element for simultaneous repair of broken or interupted column conductors and provides electrical connection between the drain contact D of the thin layer transistor 19 with the cover elctrode 25 of the memory condensor 21. In an additional step a layer 22 of silicon nitride, silicon oxide or silicon oxynitride is applied as a passivating layer, for protection from environmental influences.

Figure 16:
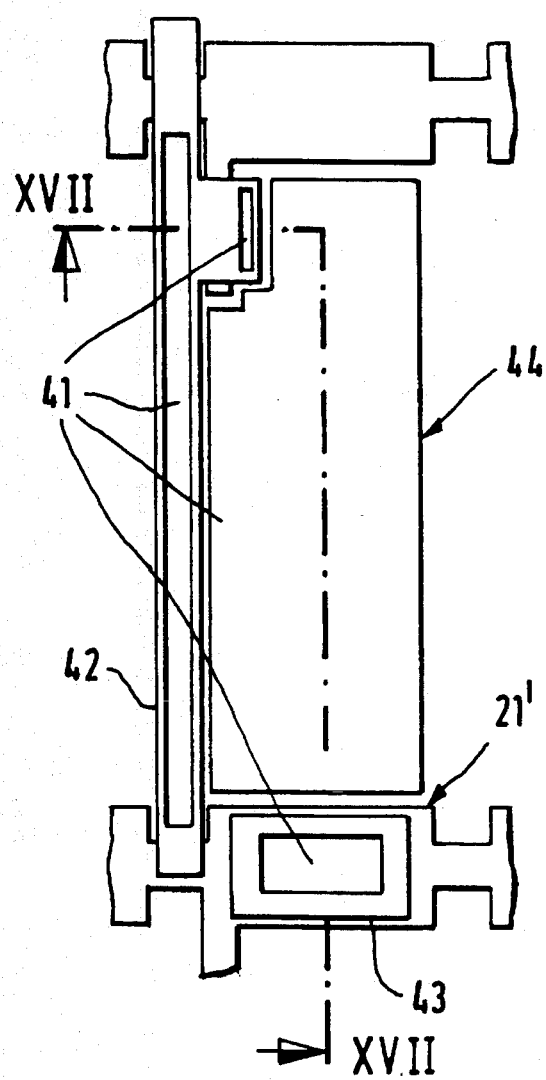
FIG. 16 is a top view of the screen element according to FIG. 10 in a fourth process step according to the second embodiment of the invention.
Figure 17:
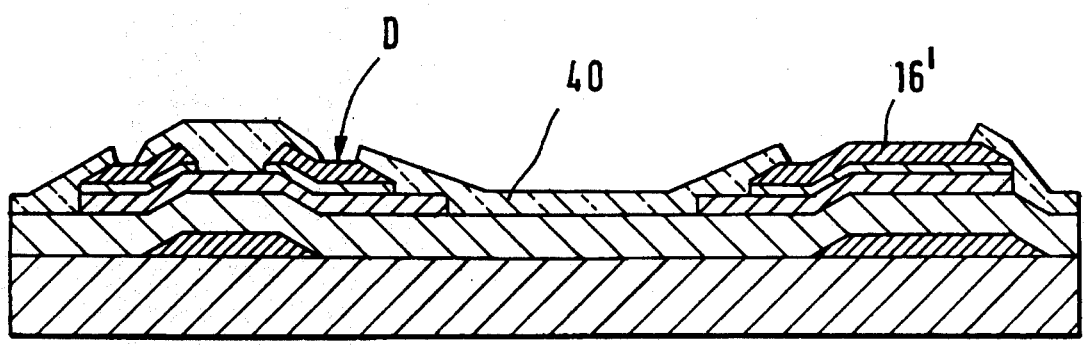
FIG. 17 is a transverse cross-sectional view through the screen element shown in FIG. 16 taken along the section line XVII—XVII in FIG. 16.
Figure 18:
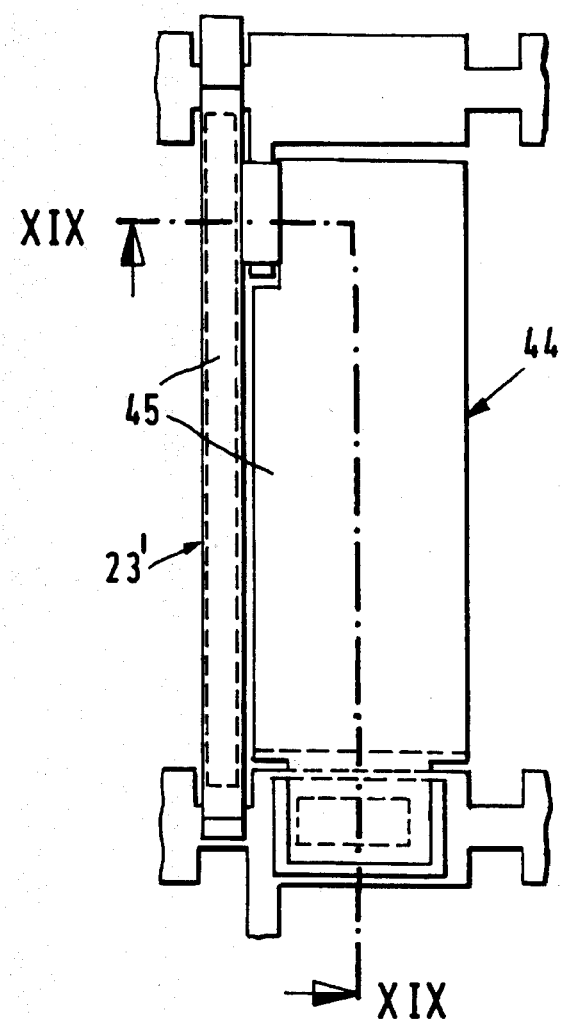
FIG. 18 is a top view of the screen element according to FIG. 1 at the end of the process according to the second embodiment of the invention.
Figure 19:
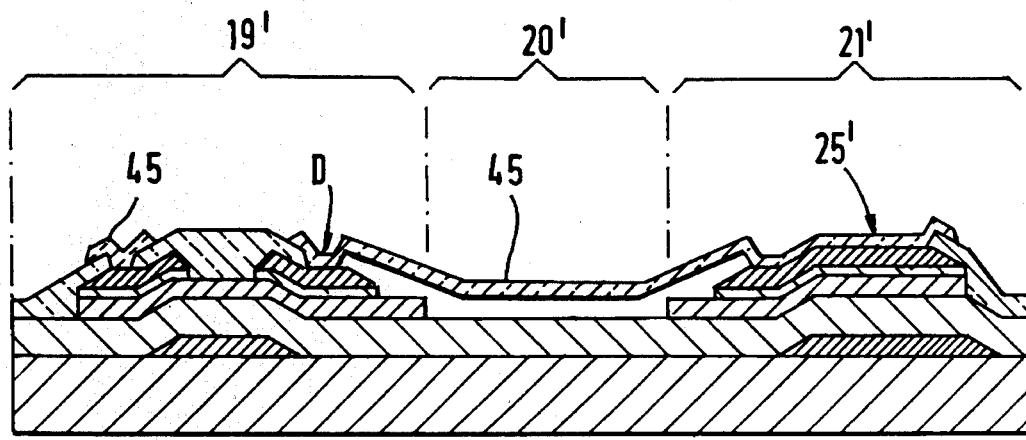
FIG. 19 is a transverse cross-sectional view through the screen element shown in FIG. 18 taken along the section line XIX—XIX in FIG. 18.

FIGS. 10 to 19 show a second embodiment of the process according to the invention for making a screen element of a liquid crystal display screen according to a five mask process. The process steps shown in FIGS. 10 to 15 correspond to the process steps of FIGS. 1 to 6 of the first embodiment, the four mask process. For the description of these first steps of the second embodiment of the method reference is made to the previous description of the steps described in conection with FIGS. 1 to 6 which is the same. The process step of the second embodiment of the method shown in FIGS. 16 and 17 is however different from the corresponding process step of the first embodiment. As shown in FIGS. 16 and 17 in the five mask process, after structuring of the undoped semiconductor layer 14' (FIGS. 14, 15) an insulating layer 40 made of silicon nitride, silicon oxide or silicon oxynitride can be applied by a CVD- or PECVD process as described above. Subsequently the insulating layer 40 is structured by conventional photolithographic technology techniques and a plasma or wet chemical etching step. The insulator 40 is removed in the structuring step in the region 41 indicated in FIG. 16, the connecting points of the column and row conductors (11',12') in the outer portion of the matrix, in contact holes 42 in the column conductors 23' and in the vicinity of the drain contacts D and the cover electrode 43 of the memeory capacitor 21'. Furthermore the insulating layer is etched away in the vicinity of the further screen element electrode 44 to increase the transmission. In FIGS. 18 and 19 the final step of the five mask process according to the invention, namely the sputtering or vapor deposition of a transparent conductive layer 45 such as indium-zinc oxide and structuring according to conventional photolithographic techniques and a wet chemical or plasma etching process, is shown. The transparent conductive layer 45 forms the actual screen element electrode 44 and a redundant component for simultaneous repair of the interrupted columns and provides an electrically conductive connection between drain contacts D of the thin layer transistors 19' and the cover electrodes 43 of the memory capacitors 21'. Furthermore the second conductive layer 45 covers the connecting points of the column conductors 23' and the row conductors and guarantees that a reliable electrical connection for connecting the display screen to an associated external driver circuit means is provided.

While the invention has been illustrated and described as embodied in a process for making a matrix of thin layer transistors, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

What is claimed is:

1. A process for making a matrix of thin layer transistors with memory capacitors comprising the steps of:

a) forming a first electrically conductive layer on a substrate (10) and, in a first mask step, etching the first electrically-conductive layer to form row conductors (11) of the thin layer transistors, gate contacts (G) of the thin layer transistors (19) and ground electrodes (12) of the memory capacitors (21);

b) forming a gate-insulating layer (13) for the thin layer transistors (19) on the first electrically conductive layer on the substrate and the substrate;

c) forming an undoped semiconductor layer (14) on the gate-insulating layer (13) and the substrate (10);

d) forming a p- or n-doped semiconductor layer (15) on the undoped semiconductor layer (14) and the substrate

(10) to provide drain and source contacts (D,S) of the thin layer transistors (19);

e) forming a second electrically conductive layer on the doped semiconductor layer and etching the second electrically conductive layer (16) to form column conductors (23) of the thin layer transistors (19), second conductor layers for the drain and source contacts (D,S) of the thin layer transistors (19) and counter electrodes (25) of the memory capacitors (21) in a second mask step;

f) plasma etching of the doped semiconductor layer (15) with the second conductor layer acting as mask and determining when the plasma etching is finished by monitoring optical emission from an etching plasma used for the plasma etching;

g) etching the undoped semiconductor layer (14) in a third mask step;

h) forming a transparent conductive layer thereon and etching the transparent conductive layer (18) to form a screen element electrode (20) and metallizing to form column conductors (23) of thin layer transistors (19) and an electrically conductive connection of the drain contacts (D) of the thin layer transistors (19) with the counter electrodes (25) of the memory capacitors (21) in a fourth mask step; and i) forming a transparent passivating layer (22) over said layers (13,14,15,16,18) on said substrate (10).

2. A process as defined in claim 1, wherein said undoped semiconductor layer (14) is an a-Si:H semiconductor layer.

3. A process as defined in claim 1, wherein the step of monitoring of the optical emission from the etching plasma includes measuring an intensity of the optical emission of the etching plasma at 240.4 nm to determine when said plasma etching is finished.

4. A process as defined in claim 1, further comprising etching of the gate-insulating layer (13) at the same time as etching of the undoped semiconductor layer (14).

5. A process as defined in claim 1, wherein the first electrically conductive layer is made from at least one member selected from the group consisting of chromium, aluminum, molybdenum, and tantalum.

6. A process as defined in claim 1, wherein said gate-insulating layer (13) consists of a 400 nm thick silicon nitride layer, said undoped semiconductor layer (14) consists of a 130 nm thick a-Si:H semiconductor layer and said gate-insulating layer (13) and said undoped semiconductor layer (14) are deposited on said substrate (10) with a 200 nm thick chromium layer as said first electrically conductive layer for the row conductors (11), the gate-contacts (G) of the thin layer transistors (19) and the ground electrodes (12) of the memory capacitors (21).

7. A process as defined in claim 1, wherein the step of forming of the gate-insulating layer (13), the undoped semiconductor layer (14) and the doped semiconductor layer (15) for the drain and source contacts (D,S) by plasma enhanced vapor deposition without interruption of a vacuum used in said plasma enchanced vapor deposition.

8. A process as defined in claim 7, further comprising protecting the insulating layer (13) at cross-over positions of the row conductors (11) and column conductors (23) of the thin layer transistors (19) during all etching processes by the second conductive layer (16).

9. A process for making a matrix of thin layer transistors with memory capacitors comprises the steps of:

a) forming a first electrically conductive layer on a substrate (10') and, in a first mask step, etching the first electrically conductive layer to form row conductors (11') of the thin layer transistors, gate contacts (G) of the thin layer transistors (19') and ground electrodes (12') of the memory capacitors (21');

b) forming a gate-insulating layer (13') for the thin layer transistors (19') on first electrically conductive layer on the substrate (10');

c) forming an undoped semiconductor layer (14') on the gate-insulating layer (13') and the substrate (10');

d) forming a p- or n-doped semiconductor layer (15') on the undoped semiconductor layer (14') and the substrate (10') to provide drain and source contacts (D,S) of the thin layer transistors (19');

e) forming a second electrically conductive layer on the doped semiconductor layer and etching the second electrically conductive layer (16') to form column conductors (23') of the thin layer transistors (19'), second conductor layers for the drain and source contacts (D,S) of the thin layer transistors (19') and counter electrodes (25') of the memory capacitors (21') in a second mask step;

f) plasma etching of the doped semiconductor layer (15') with the second conductor layer acting as mask and determining when the etching process is finished by monitoring optical emission from an etching plasma used for the plasma etching;

g) etching the undoped semiconductor layer (14') in a third mask step;

h) forming a transparent insulating layer thereon and etching the transparent insulating layer (40) in a fourth mask step, portions of said insulating layer (40) being removed from the connection points, the drain contacts (D) of the thin layer transistors (19') and the counter electrodes (25') of the memory capacitor (21') in the structuring; and i) forming a transparent conductive layer thereon and etching the transparent conductive layer (45) in a fifth mask step to form a screen element electrode.

10. A process as defined in claim 9, wherein said undoped semiconductor layer (14') is an a-Si:H semiconductor layer.

11. A process as defined in claim 9, wherein the step of monitoring of the optical emission from the etching plasma includes measuring an intensity of the optical emission of the etching plasma at 240.4 nm to determine when said plasma etching is finished.

12. A process as defined in claim 9, further comprising removing the transparent insulating layer (40) in a fourth mask step in the vicinity of a screen element electrode (44) of a liquid crystal screen.

13. A process as defined in claim 9, wherein the step of etching of said transparent conductive layer (45) is such that a direct conductive connection between the drain contacts (D) of the thin layer transistors (19'), the column conductors (23') and the counter electrodes (25') of the memory capacitor (21') arises.

14. A process as defined in claim 9, wherein the transparent conductive layer (45) covers connection points of the row conductors (11') and the column conductors (23') and further comprising metallizing the column conductors (23').

15. A process as defined in claim 9, further comprising etching of the gate-insulating layer (13') at the same time as etching of the undoped semiconductor layer (14').

16. A process as defined in claim 9, wherein the first electrically conductive layer is made from at least one member selected from the group consisting of chromium, aluminum, molybdenum, and tantalum.

17. A process as defined in claim 9, wherein said gate-insulating layer (13') consists of a 400 nm thick silicon nitride layer, said undoped semiconductor layer (14') consists of a 130 nm thick a-Si:H semiconductor layer and said gate-insulating layer (13') and said undoped semiconductor layer (14') are deposited on said substrate (10') with a 200 nm thick chromium layer acting as said first electrically conductive layer for the row conductors (11'), the gate-contacts (G) of the thin layer transistors (19') and the ground electrodes (12') of the memory capacitors (21').

18. A process as defined in claim 9, wherein the step of forming of the gate-insulating layer (13'), the undoped semiconductor layer (14') and the doped semiconductor layer (15') for the drain and source contacts (D,S) occurs by plasma enhanced vapor deposition without interruption of a vacuum used in said plasma enchanced vapor deposition.

19. A process as defined in claim 18, further comprising protecting the insulating layer (13') at cross-over positions of the row conductors (11') and column conductors (23') of the thin layer transistors (19') during all etching processes by the second conductive layer (16').

* * * * *